(12) United States Patent
Riviere et al.

(10) Patent No.: US 10,965,376 B2
(45) Date of Patent: Mar. 30, 2021

(54) COVER FOR AN ELECTRONIC CIRCUIT PACKAGE

(71) Applicant: STMICROELECTRONICS (GRENOBLE 2) SAS, Grenoble (FR)

(72) Inventors: Jean-Michel Riviere, Froges (FR); Romain Coffy, Voiron (FR); Karine Saxod, Les Marches (FR)

(73) Assignee: STMICROELECTRONICS (GRENOBLE 2) SAS, Grenoble (FR)

( * ) Notice: Subject to any disclaimer, the term of this patent is extended or adjusted under 35 U.S.C. 154(b) by 0 days.

(21) Appl. No.: 16/218,948

(22) Filed: Dec. 13, 2018

(65) Prior Publication Data
US 2019/0190606 A1  Jun. 20, 2019

(30) Foreign Application Priority Data
Dec. 15, 2017  (FR) ..................... 1762276

(51) Int. Cl.
| H04B 10/40 | (2013.01) |
| H05K 7/02 | (2006.01) |
| H05K 5/03 | (2006.01) |
| H04B 10/80 | (2013.01) |
| H01L 31/16 | (2006.01) |
| H01L 31/0203 | (2014.01) |

(52) U.S. Cl.
CPC ......... *H04B 10/40* (2013.01); *H01L 31/0203* (2013.01); *H01L 31/162* (2013.01); *H04B 10/80* (2013.01); *H05K 5/03* (2013.01); *H05K 7/02* (2013.01)

(58) Field of Classification Search
CPC .......... H04B 10/40; H04B 10/80; H05K 5/03; H05K 7/02; H01L 31/0203; H01L 31/0216; H01L 31/0232; H01L 33/52; H04N 5/225

USPC ......................................... 398/138
See application file for complete search history.

(56) References Cited

U.S. PATENT DOCUMENTS

| 6,531,341 | B1 | 3/2003 | Peterson et al. | |
| 7,612,383 | B2 | 11/2009 | Andrews et al. | |
| 7,760,332 | B2* | 7/2010 | Yamaguchi | G01S 7/4813 356/3.06 |
| 7,848,639 | B2* | 12/2010 | Kinoshita | G02B 7/02 396/535 |
| 9,519,109 | B2* | 12/2016 | Sakai | B32B 37/24 |
| 9,831,357 | B2* | 11/2017 | Jin | H01L 31/02162 |
| 9,893,259 | B2 | 2/2018 | Kim et al. | |
| 9,971,060 | B2* | 5/2018 | Weng | G01J 1/4204 |
| 10,304,793 | B2* | 5/2019 | Lu | H01L 24/24 |
| 2002/0145676 | A1 | 10/2002 | Kuno et al. | |
| 2004/0067015 | A1* | 4/2004 | Nakajima | G02B 6/32 385/33 |
| 2004/0094825 | A1 | 5/2004 | Onishi et al. | |
| 2005/0270403 | A1* | 12/2005 | Adachi | H04N 5/225 348/340 |

(Continued)

FOREIGN PATENT DOCUMENTS

WO  2016010425 A1  1/2016

*Primary Examiner* — Abbas H Alagheband
(74) *Attorney, Agent, or Firm* — Seed Intellectual Property Law Group LLP

(57) ABSTRACT

A cover for an electronic circuit package, including: a body having an opening extending therethrough; a first element located in the opening and having a surface continuing planar or rounded shapes of a surface of the cover; and a second element of connection of the first element to the body.

16 Claims, 6 Drawing Sheets

(56) References Cited

U.S. PATENT DOCUMENTS

| | | | |
|---|---|---|---|
| 2006/0091487 A1 | 5/2006 | Hanada et al. | |
| 2008/0001241 A1* | 1/2008 | Tuckerman | H01L 31/0203 257/434 |
| 2008/0002460 A1* | 1/2008 | Tuckerman | H01L 31/0203 365/158 |
| 2008/0150065 A1 | 6/2008 | Oda | |
| 2008/0175605 A1 | 7/2008 | Sakurai | |
| 2009/0021842 A1* | 1/2009 | Berge | G02B 26/005 359/666 |
| 2009/0212306 A1 | 8/2009 | Bogner et al. | |
| 2009/0269075 A1* | 10/2009 | Wong | G02B 6/4246 398/135 |
| 2011/0248152 A1 | 10/2011 | Svajda et al. | |
| 2011/0260176 A1 | 10/2011 | Onoe et al. | |
| 2012/0056217 A1 | 3/2012 | Jung et al. | |
| 2012/0091500 A1 | 4/2012 | Matoba et al. | |
| 2012/0104454 A1* | 5/2012 | Coffy | H01L 31/0203 257/100 |
| 2012/0242884 A1* | 9/2012 | Ishiguro | H01L 27/14623 348/340 |
| 2014/0084322 A1 | 3/2014 | Park et al. | |
| 2014/0361200 A1 | 12/2014 | Rudmann et al. | |
| 2015/0138436 A1* | 5/2015 | Wong | H01L 27/14683 348/374 |
| 2015/0243802 A1* | 8/2015 | Fujimoto | H01L 33/486 257/82 |
| 2015/0325613 A1 | 11/2015 | Rudmann et al. | |
| 2015/0340351 A1 | 11/2015 | Rossi et al. | |
| 2016/0025855 A1 | 1/2016 | Camarri et al. | |
| 2016/0216138 A1 | 7/2016 | Rudmann et al. | |
| 2016/0293585 A1 | 10/2016 | Geiger | |
| 2017/0038459 A1 | 2/2017 | Kubacki et al. | |
| 2017/0113922 A1* | 4/2017 | Huang | B81B 7/0067 |
| 2017/0213940 A1 | 7/2017 | Sakai et al. | |
| 2018/0006003 A1 | 1/2018 | Nagarajan et al. | |
| 2018/0190858 A1* | 7/2018 | Lin | H01L 31/02327 |
| 2018/0331236 A1* | 11/2018 | Luan | H01L 31/173 |
| 2019/0139947 A1 | 5/2019 | Saxod et al. | |
| 2019/0189859 A1 | 6/2019 | Riviere et al. | |
| 2019/0189860 A1 | 6/2019 | Riviere et al. | |
| 2020/0127156 A1* | 4/2020 | Camarri | H01L 31/167 |

\* cited by examiner

COVER FOR AN ELECTRONIC CIRCUIT PACKAGE

BACKGROUND

Technical Field

The present disclosure generally relates to the field of electronic circuits, and more particularly to covers and methods for forming of covers for integrated circuit packages.

Description of the Related Art

Certain electronic circuits comprise an electronic chip housed in a package. Such a package often comprises a support portion having the chip affixed thereto, and a cover portion covering the chip.

When the electronic circuit is an optical signal transmit and/or receive circuit, such as a time-of-flight measurement proximity sensor, the electronic chip comprises optical signal transmit and receive regions. The cover then comprises, opposite the transmit/receive regions, elements transparent for the wavelengths of optical signals, for example, made of glass, such as lenses.

Similarly, in various other types of electronic circuits, elements are positioned in the cover.

BRIEF SUMMARY

One or more embodiments are directed to electronic optical transmission/reception circuits, such as proximity sensors.

One embodiment is directed to a cover for an electronic circuit package, comprising: a body having an opening extending therethrough; a first element located in the opening and having a surface continuing planar or rounded shapes of a surface of the cover; and a second element of connection of the first element to the body.

According to an embodiment, the first element is transparent, filtering, or comprises a lens.

According to an embodiment, the second element bonds to the body and to the first element.

According to an embodiment, the first element is flush with a first surface of the body.

According to an embodiment, the second element is located between a side of the first element and a wall of the opening.

According to an embodiment, the second element forms a layer covering a second surface of the body opposite to the first surface.

According to an embodiment, the material of said layer is the same as that of the body.

According to an embodiment, the opening comprises a shoulder.

According to an embodiment, the second element is at least partly located in a housing formed by the shoulder, by a side of the first element, and by a wall of the opening.

According to an embodiment, the second element forms on the side of said surface of the cover a layer covering a surface of the body.

According to an embodiment, the first element has a peripheral portion located against a shoulder in the opening, the shoulder facing said layer.

An embodiment provides an electronic optical transmission and/or reception circuit comprising a cover such as hereabove.

An embodiment provides a method of manufacturing a cover such as hereabove.

According to an embodiment, the method comprises the steps of: a) forming the body and the opening; b) arranging on an adhesive support the body and the first element; and c) forming the second element.

According to an embodiment, the method comprises, after step c), removing the adhesive support.

According to an embodiment, the method comprises, before step b), arranging, on the adhesive support, between the future location of a side of the first element and the future location of a wall of the opening, a portion of a material intended to form at step c) the second element.

According to an embodiment, the second element is formed by molding.

According to an embodiment, the molding is assisted by a film.

The foregoing and other features and advantages will be discussed in detail in the following non-limiting description of specific embodiments in connection with the accompanying drawings.

DETAILED DESCRIPTION

Figure 1:
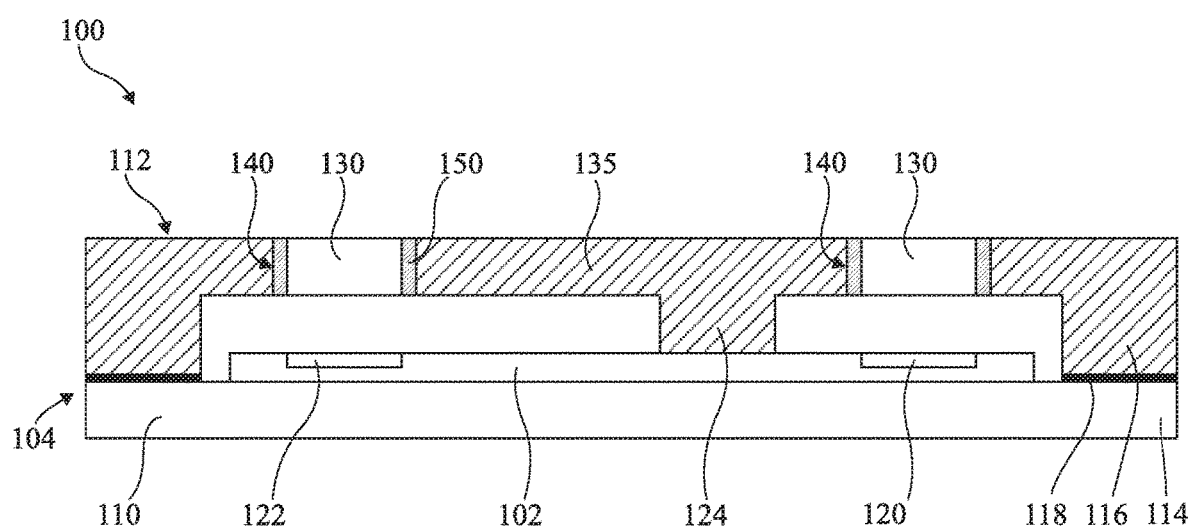
FIG. 1 is a simplified cross-section view of an embodiment of an electronic circuit.

The same elements have been designated with the same reference numerals in the various drawings and, further, the various drawings are not to scale. For clarity, only those steps and elements which are useful to the understanding of the described embodiments have been shown and are detailed. In particular, the electronic chip and the package elements other than the cover are not detailed, the described embodiments being compatible with most current electronic packages and chips.

In the following description, when reference is made to terms qualifying absolute positions, such as terms "front," "rear," "top," "bottom," "left," "right," etc., or relative positions, such as terms "above," "under," "upper," "lower," etc., or to terms qualifying directions, such as terms "horizontal," "vertical," etc., it is referred to the orientation of the drawings, it being understood that, in practice, the described devices may be oriented differently. Unless otherwise specified, expressions "approximately," "substantially," and "in the order of" mean to within 10%, preferably to within 5%.

FIG. 1 is a cross-section view of an embodiment of an electronic circuit 100. Electronic circuit 100 comprises an electronic chip 102 housed in a package 104. The electronic chip 102 includes semiconductor material with one or more integrated circuits as is well known in the art.

Package 104 comprises a support 110 and a cover 112 stacked on each other. Chip 102 is arranged on a central portion of support 110, in a closed space delimited by support 110 and cover 112. Support 110 and cover 112 have peripheral portions 114 and 116 which are mechanically connected, typically by glue 118.

As an example, chip 102 comprises an optical transmission region 120 and an optical reception region 122. Optical transmission/reception regions 120 and 122 are for example separated by an opaque partition (or portion) 124 of a body 135 of the cover. The cover comprises transparent elements 130 located opposite optical transmission/reception regions 120 and 122.

More generally, according to the type of electronic circuit, one or a plurality of elements of any type may be provided instead of the two transparent elements 130 of this example.

The cover comprises the body 135 comprising openings 140 having elements 130 housed therein. Elements 130 are flush with a surface of the body, for example, the surface facing the outside of the circuit (upper surface). Elements 130 are affixed in openings 140 by mechanical bonding elements, for example, glue 150 arranged between the sides of elements 130 and the walls of openings 140.

As an example, each element 130 has a constant thickness, for example, in the range from 100 µm to 400 µm.

The body may have, around element 130, the same thickness as element 130 and elements 130 are thus flush with the lower surface of the body. Elements 130 have dimensions, for example, diameters of circular elements 130 or side lengths of rectangle-shaped elements 130, for example in the range from 300 µm to 1 mm.

In the following description, embodiments of methods of manufacturing an electronic circuit cover are described. In such methods, preferably, a plurality of covers, for example, arranged in an array, are simultaneously manufactured, and the covers are individualized in a sawing step.

Figure 2A:
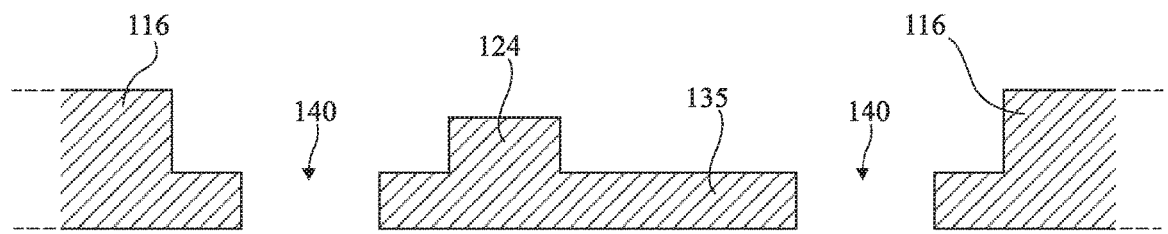
FIGS. 2A to 2C are simplified cross-section views illustrating steps of an embodiment of a method of manufacturing an electronic circuit cover.
Figure 2B:
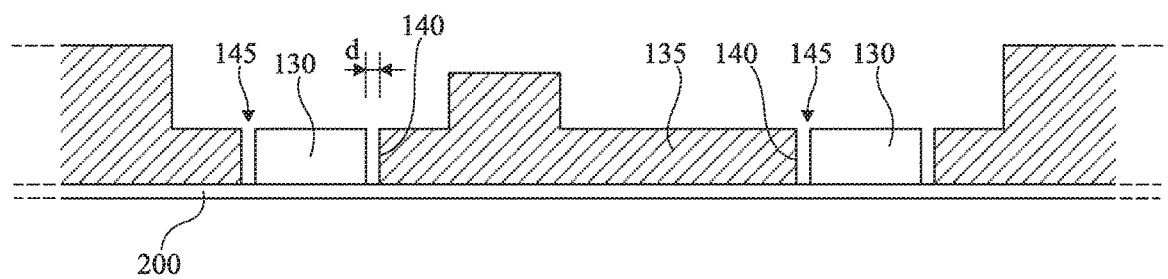
Figure 2C:
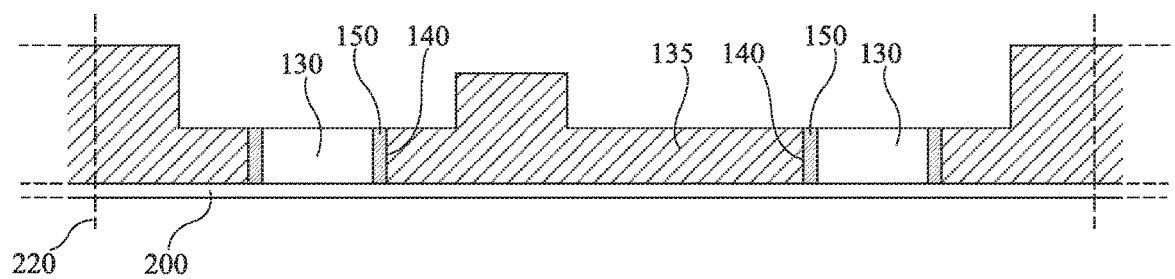

FIGS. 2A to 2C are simplified cross-section views illustrating successive steps of an embodiment of a method of manufacturing an electronic circuit cover.

At the step of FIG. 2A, body 135 having openings 140, for example, two openings 140, extending therethrough, is formed. Body 135 comprises peripheral portions 116 intended to be glued to the peripheral portions of support 110, and partition 124 intended to be in contact with chip 102. The body is for example formed by molding. As an example, body 135 is made of a thermosetting polymer.

At the step of FIG. 2B, body 135 is positioned on an adhesive support 200 and elements 130 are positioned in openings 140. The horizontal dimensions of each element 130 are smaller than those of the corresponding opening. Elements 130 and the body are not in contact. This leaves open spaces 145 between the sides of elements 130 and the walls of openings 140. Distance d between the sides of elements 130 and the walls of openings 140 is for example in the range from 20 to 50 µm.

Adhesive support 200 is provided to, in the rest of the process, hold in place body 135 and elements 130, which are positioned on the adhesive support, and to be subsequently removable. As an example, adhesive support 200 is an adhesive film, comprising a film, for example, polymer, having a thickness for example in the range from 10 to 100 µm, covered with a layer of an adhesive allowing a temporary mechanical bonding. As an example, adhesives known under trade names "Lintec C-902" or "Nitto Revalpha" may be used.

At the step of FIG. 2C, spaces 145 are filled with an adhesive, such as glue 150. As an example, thermally activatable glue, such as for example that known under trade name "Henkel ABP8420," or glue activatable by an ultraviolet radiation, such as those known under trade names "Henkel 3707" or "Delo OB786," may be used. Thus, after the glue 150 is filled in the spaces 145, the glue 150 may be activated to bond with walls at the openings 140 and the sides of elements 130. The bonding of the glue to the walls of openings 140 and the sides of elements 130 enables to affix elements 130.

Adhesive support 200 is then removed. Neighboring covers are separated by sawing along lines 220. In the obtained cover, elements 130 are flush with the surface of the body which was in contact with adhesive support 200.

Adhesive support 200 enables to accurately hold elements 130 and body 135 in position during the arranging of glue 150. Elements 130 are thus accurately positioned in the obtained cover. This enables to avoid, in the electronic circuit, problems due to misalignments between elements 130 and the electronic chip. Indeed, the position of the cover is adjusted with respect to the chip positioned on support 110, for example, in a simple way such as by alignment of the edges of the cover and of support 110.

Figure 3:
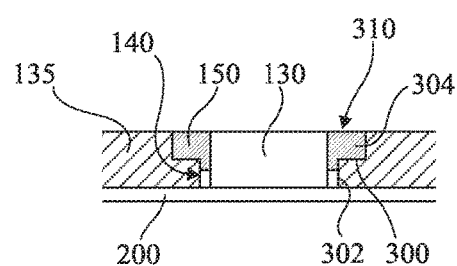
FIG. 3 is a partial simplified cross-section view illustrating a variation of the method of FIGS. 2A to 2C.

FIG. 3 is a partial simplified cross-section view illustrating a variation of the method of FIGS. 2A to 2C. An element 130 is positioned in an opening 140 of body 135, the body and element 130 being placed on adhesive support 200. The opening comprises a step feature formed by a shoulder 300 between portions 302 and 304 of the opening, the lateral dimensions of portion 302 of the opening being smaller than those of portion 304. Glue 150 is injected into a housing 310 formed by shoulder 300, by the sides of element 130, and by the walls of portion 304 of the opening.

It may be provided for the dimensions of portion 302 to be adjusted, to within a functional clearance, to the dimensions of element 130. The functional clearance is for example in the range from approximately 2 µm to approximately 15 µm, for example, in the range from 2 µm to 15 µm. This enables to particularly accurately position elements 130 in the obtained cover. According to this clearance, the glue is contained in housing 310 or penetrates into the interval between the sides of element 130 and the walls of portion 302 of opening 140.

Figure 4A:
FIGS. 4A to 4C are simplified cross-section views illustrating steps of another implementation mode of a method of manufacturing an electronic circuit cover.
Figure 4B:
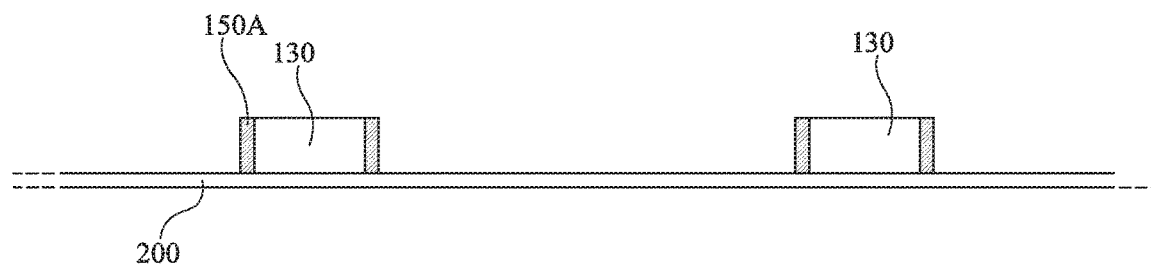
Figure 4C:
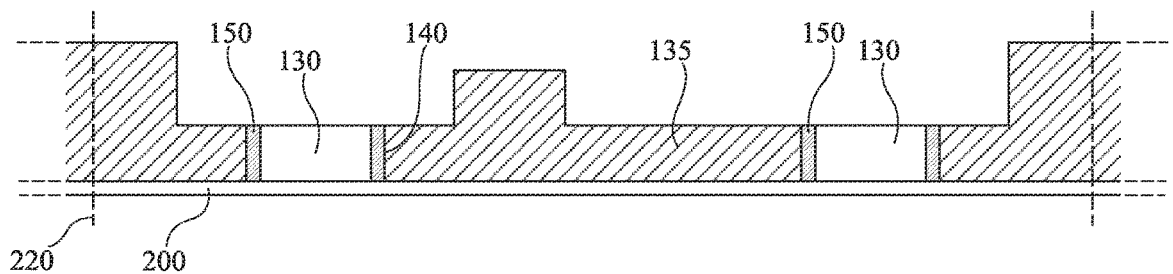

FIGS. 4A to 4C are simplified cross-section views illustrating steps of another implementation mode of a method of manufacturing an electronic circuit cover.

At the step of FIG. 4A, portions 150A of a material intended to form connection elements 150, for example, a thermoplastic material, for example, the material known under trade name "Delo GE7985," are positioned on an adhesive support 200, identical or similar to that of the method of FIGS. 2A to 2C. Portions 150A are arranged between the future location of elements 130 and the future location of the body. As an example, each portion 150A is a ring surrounding a future location of an element 130.

At the step of FIG. 4B, elements 130 are arranged on adhesive support 200 so that elements 130 are surrounded with portions 150A.

At the step of FIG. 4C, a body 135 obtained at a prior step identical or similar to the step of FIG. 2A is arranged on adhesive support 200, so that portions 150A are located in openings 140. The body is for example made of a thermosetting polymer. Connection elements 150 are then formed from portions 150A, for example, for portions 150A made of a thermoplastic material, by a heating enabling to at least partially melt the thermoplastic material, and to have the thermoplastic material bond to elements 130 and to body 135. The dimensions of body 135 are not modified during the forming of connection elements 150, whereby elements 130 are accurately positioned.

In the same way as at the step of FIG. 2C, adhesive support 200 is then removed and, in the example of a simultaneous manufacturing of a plurality of covers, neighboring covers are separated by sawing along lines 220.

As a variation, the various steps of positioning portions 150A, elements 130, and body 135 may be carried out in any order.

FIGS. 5A to 5D are simplified cross-section views illustrating steps of another embodiment of a method of manufacturing an electronic circuit cover.

Figure 5A:
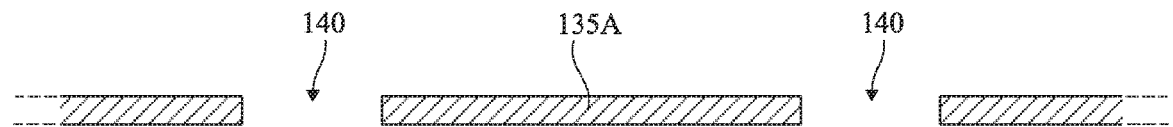
FIGS. 5A to 5D are simplified cross-section views illustrating steps of another implementation mode of a method of manufacturing an electronic circuit cover.

At the step of FIG. 5A, a body 135A is formed by implementing a step similar to that of FIG. 2A. Body 135A exhibits through openings 140. As an example, body 135A is a planar plate, without peripheral portions 116 and partition 124 of body 135 of the method of FIGS. 2A to 2C. Such a planar plate is particularly easy to obtain, particularly in the case of a simultaneous manufacturing of a plurality of covers, for example, arranged in an array.

Figure 5B:
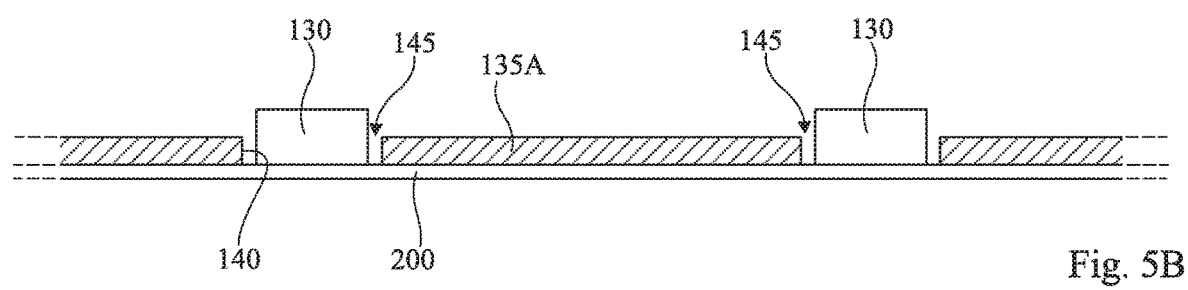

At the step of FIG. 5B, on an adhesive support 200 identical or similar to that of the method of FIGS. 2A to 2C, body 135A and elements 130 are positioned in openings 140. The thickness of body 135A is for example smaller than that of elements 130.

Figure 5C:
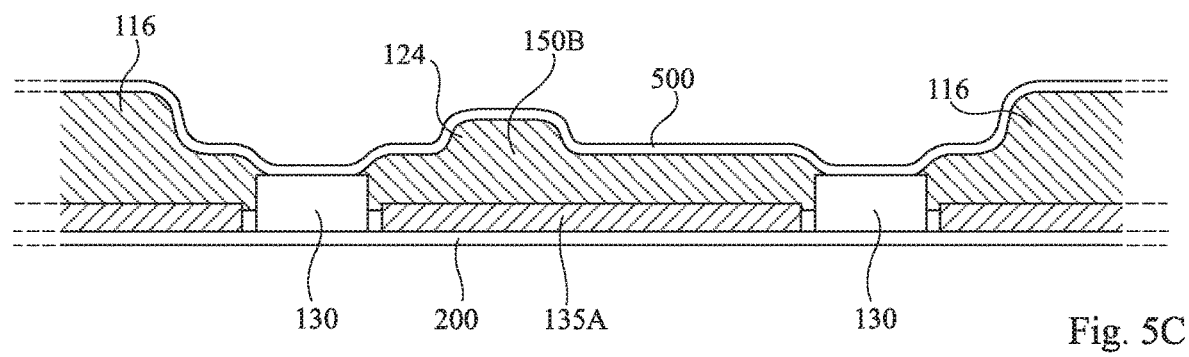

At the step of FIG. 5C, a layer 150B, for example, made of a thermosetting polymer, covering the surface of body 135A on the side opposite to adhesive support 200, is formed. Layer 150B comprises peripheral portions 116 and partition 124. Layer 150B may be formed by molding, for example, by molding assisted by a mold release film 500, where the walls of a mold (not shown) are covered with film 500 before forming layer 150B. Upon hardening, layer 150B adheres elements 130 to the body 135. Further, film 500 eases the obtaining of layer 150B by leaving the upper surface of elements 130 exposed. After molding, film 500 covers the surface of layer 150B. It is provided for the shapes of layer 150B, for example, peripheral portions 116 and partition 124, to preferably be planar or rounded, for example, having a radius of curvature greater than 10 µm, to decrease risks of film breakage during the molding.

The presence of body 135 on adhesive support 200 before the forming of layer 150B enables to avoid displacements of elements 130 resulting from deformations of adhesive support 200. The position of the elements in the cover is thus accurately obtained. Indeed, in the absence of body 135A, the inventors have observed that if the cover is directly formed on adhesive support 200, elements 130 may move during the molding, which results in an inaccuracy of the position of elements 130 in the cover. The presence of body 135 thus enables to avoid misalignments between elements 130 and the electronic chip, due to the fact that the cover is adjusted with respect to support 110 and to the chip.

Figure 5D:
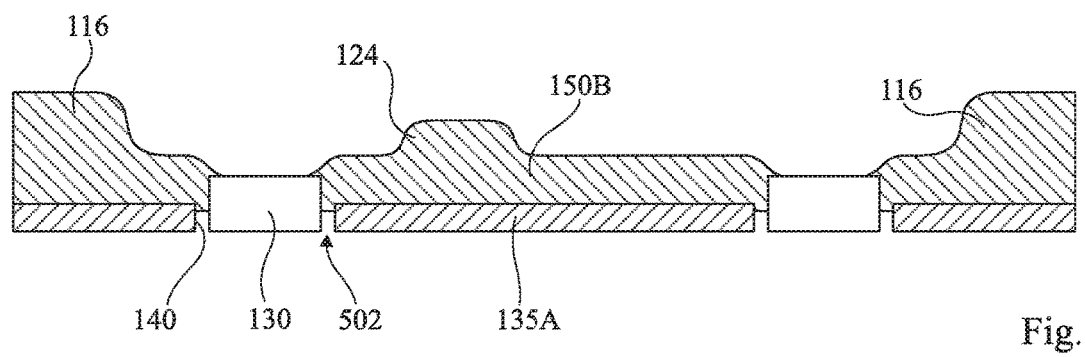

At the step of FIG. 5D, adhesive support 200 and the possible film 500 are removed.

Layer 150B bonds to body 135A. Layer 150B bonds to elements 130, for example, bonds to the sides of elements 130. Layer 150B thus forms an element of connection between elements 130 and body 135A. The material of layer 150B may penetrate into space 502 between the sides of elements 130 and the walls of openings 140. As an example, the material of layer 150B is the same material as that of body 135A.

Figure 6A:
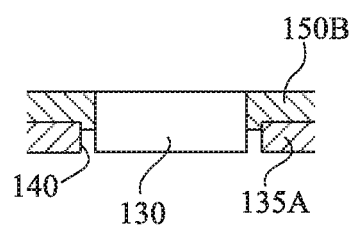
FIGS. 6A and 6B are partial simplified cross-section views illustrating variations of the method of FIGS. 5A to 5D.
Figure 6B:
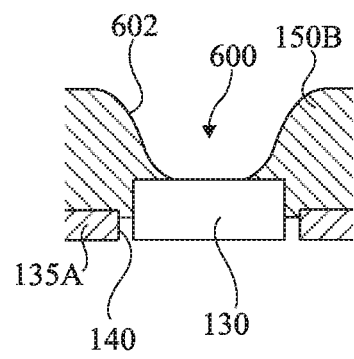

FIGS. 6A and 6B are partial simplified cross-section views illustrating variations of the method of FIGS. 5A to 5D. Variations 6A and 6B are implemented for example in the case where layer 150B is formed by film-assisted molding.

In the variation of FIG. 6A, elements 130 are flush with the surface of layer 150B.

In the variation of FIG. 6B, layer 150B exhibits on elements 130 openings 600 which flare out from elements 130 and thus exhibit flared areas 602.

FIGS. 7A to 7D are simplified cross-section views illustrating steps of another embodiment of a method of manufacturing an electronic circuit cover.

Figure 7A:
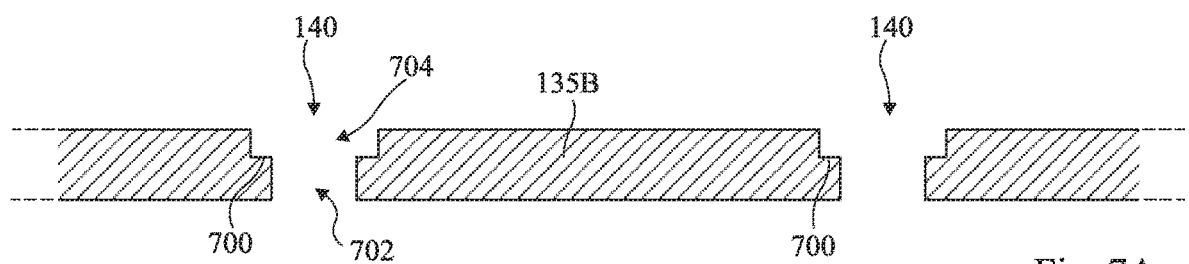
FIGS. 7A to 7D are simplified cross-section views illustrating steps of another implementation mode of a method of manufacturing an electronic circuit cover.

At the step of FIG. 7A, a body 135B is formed by implementing a step similar to that of FIG. 2A. Body 135B has through openings 140. As an example, body 135B does not comprise peripheral portions 116 and partition 124 of body 135 of the method of FIGS. 2A to 2C. Each opening 140 comprises an upward-facing shoulder 700 between a lower portion 702 and an upper portion 704 of the opening.

Figure 7B:
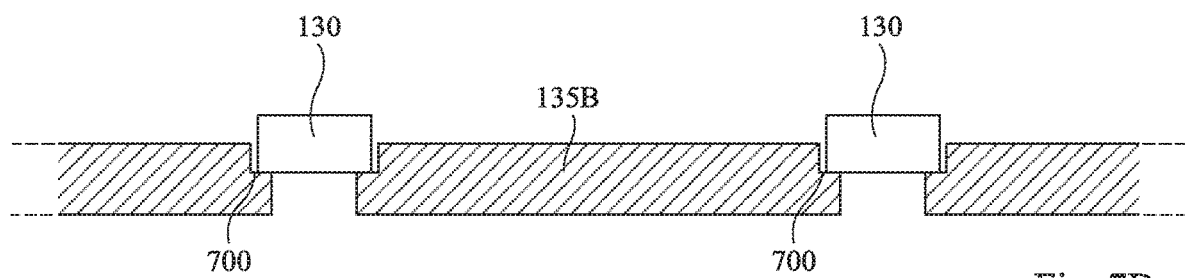

At the step of FIG. 7B, body 135A and elements 130 are positioned in openings 140 against shoulders 700. As an example, the depth of upper portion 704 of each opening 140 is smaller than the thickness of the considered element 130, so that element 130 protrudes from the upper surface of body 135B.

Figure 7C:
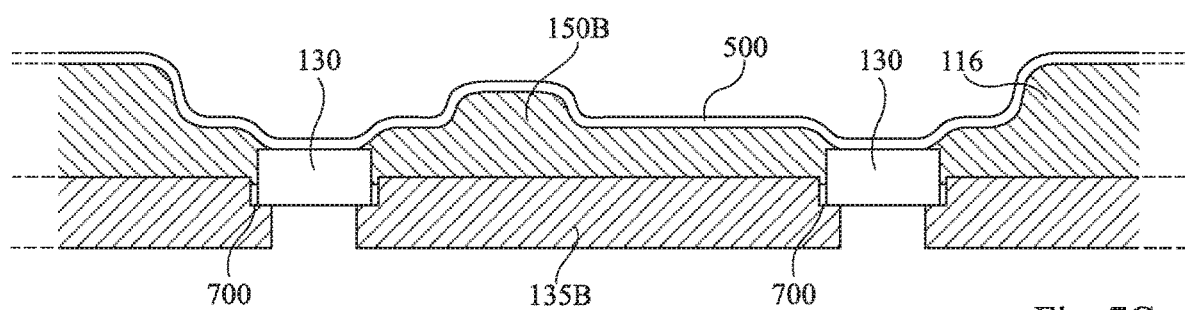

At the step of FIG. 7C, a layer 150B identical or similar to that described in relation with FIGS. 5A to 5D is formed. Layer 150B is preferably obtained by molding, for example, assisted by a film 500. In particular, the shapes of layer 150B are planar or rounded, for example, with a radius of curvature greater than 10 µm. The upper surface of each element 130 continues the planar or rounded shapes. Elements 130 may be flush with locally planar portions of the upper surface of layer 150B. This enables to decrease risks of breakage of film 500 during the molding. The variations of FIGS. 6A and 6B may be implemented.

During the molding, elements 130 remain in place in openings 140 of body 135B. This enables to avoid displacements of elements 130. The position of the elements in the cover is thus accurately obtained. The presence of body 135B thus enables to avoid misalignments between elements 130 and the electronic chip.

Figure 7D:
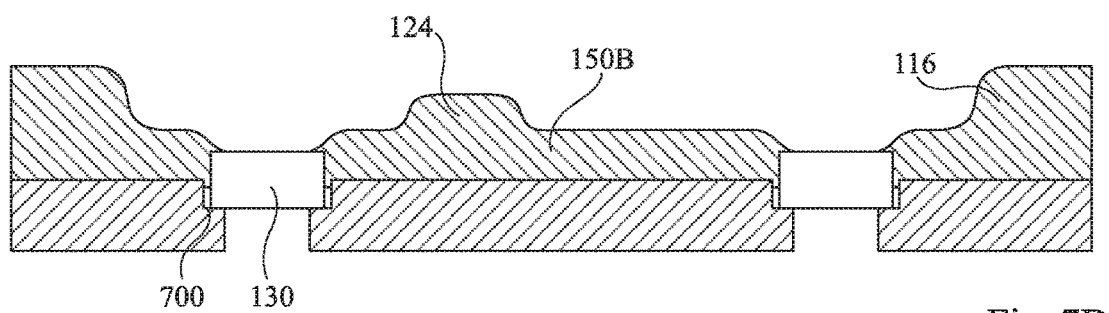

At the step of FIG. 7D, film 500 is removed.

Layer 150B bonds to body 135B. Layer 150B bonds to elements 130, for example, bonds to the sides of elements 130. Layer 150B thus forms an element of connection between elements 130 and body 135B. The material of layer 150B may penetrate into the space between the sides of elements 130 and the walls of openings 140.

As an example, the material of layer 150B is the same material as that of body 135B.

Specific embodiments have been described. Various alterations, modifications, and improvements will occur to those skilled in the art. In particular, the surface of body 135 or 135A in contact with adhesive support 200, although it has been shown as planar, may exhibit level variations, for example, have rounded shapes easing a film-assisted molding of the body. Elements 130 have surfaces continuing such level variations, or may be flush with locally planar portions of the considered surface of the body.

Further, although examples applied to transparent elements 130 have been described, all the described embodiments more generally apply to any element housed in a cover for which the same problems are posed, particularly elements comprising lenses, for example, for focusing optical signals, or filtering elements enabling to remove all or part of optical radiations having wavelengths different from those of optical signals transmitted or received by the integrated circuit.

Finally, the practical implementation of the described embodiments is within the abilities of those skilled in the art based on the functional indications given hereabove.

Such alterations, modifications, and improvements are intended to be part of this disclosure, and are intended to be within the spirit and the scope of the present invention. The various embodiments described above can be combined to provide further embodiments. These and other changes can be made to the embodiments in light of the above-detailed description. Accordingly, the foregoing description is by way of example only and is not intended to be limiting. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A cover for an electronic circuit package, comprising:
   a body having first and second surfaces and first and second through openings extending between the first and second surfaces, wherein the first and second through openings include first and second recesses, respectively, formed by respective walls in the first and second through openings;
   a first element located in the first through opening and having a surface exposed at the first surface of the body, the first element having lateral sides spaced apart from the first recess;
   a second element located in the second through opening and having a surface exposed at the first surface of the body, the second element having lateral sides spaced apart from the second recess; and
   adhesive material bonding the lateral sides of the first and second elements to the respective walls of the body in the first and second through openings, respectively, wherein the adhesive material fills the first and second recesses and abuts the lateral sides of the first and second elements, respectively.

2. The cover of claim 1, wherein the first element is one of: a transparent material, a filter, or a lens.

3. The cover of claim 1, wherein the first and second through openings are wider at the second surface than at the first surface.

4. The cover of claim 1, wherein the surface of the first element is coplanar with the first surface of the body.

5. The cover of claim 1, wherein the adhesive material is glue or molding material.

6. The cover of claim 1, wherein the adhesive material is bonded to walls of the first element and the second element and is a layer covering the second surface of the body.

7. The cover of claim 6, wherein the adhesive material is a molding material.

8. The cover of claim 1, comprising adhesive material covering the second surface of the body.

9. An electronic optical transmit and receive circuit, comprising:
   a substrate;
   a semiconductor chip coupled to the substrate; and
   a cover coupled to the substrate and enclosing the semiconductor chip, the cover including:
      a body having first and second surfaces, first and second through openings extending through the body from the first surface to the second surface, wherein the first and second through openings include respective first and second recesses formed by respective first and second shoulders in the respective first and second through openings;
      a first optical element located in the first through opening and a second optical element located in the second through opening, wherein lateral sides of the first and second optical elements are spaced apart from the respective first and second recesses; and
      wherein lateral sides of the first and second optical elements abut adhesive material that bonds the first and second optical elements to walls of the body.

10. The electronic optical transmit and receive circuit of claim 9, wherein the first and second optical elements have first and second surfaces, respectively, wherein the first and second surfaces of the first and second optical elements are coplanar with the first and second surfaces of the body, respectively.

11. The electronic optical transmit and receive circuit of claim 9, wherein the first surface of the body is non-planar, wherein the body is coupled to the substrate by adhesive.

12. The electronic optical transmit and receive circuit of claim 9, wherein the adhesive material is glue or molding material.

13. The electronic optical transmit and receive circuit of claim 9, wherein the body includes a first planar layer and a second layer, the second layer having a curved surface.

14. A method comprising:
   forming a body with first and second through openings, the first and second through openings including respective shoulders formed by the body that form first and second recesses, respectively;
   arranging the body on an adhesive support;
   arranging first and second optical elements on the adhesive support and in the first and second through openings such that lateral sides of the first and second optical elements are spaced apart from the first and second recesses; and
   using an adhesive material, filling the first and second recesses and coupling the first and second optical elements to the body.

15. The method of claim 14, wherein the adhesive material is a molding material that is molded to side surfaces of the optical element and to a surface of the body.

16. The method of claim 14, wherein coupling the optical element to the body comprises depositing adhesive material along side surfaces of the optical element and hardening the adhesive material.

* * * * *